(12) United States Patent
Meno (10) Patent No.: US 6,320,466 B1
(45) Date of Patent: Nov. 20, 2001

(54) AMPLIFIER CIRCUIT

(75) Inventor: Fumio Meno, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/436,571

(22) Filed: Nov. 9, 1999

(30) Foreign Application Priority Data

Nov. 19, 1998 (JP) ................................................ 10-318028

(51) Int. Cl.⁷ .................................................... H03F 3/45
(52) U.S. Cl. ............................................... 330/252; 360/46
(58) Field of Search ............................ 330/252; 360/46, 360/67, 68

(56) References Cited

U.S. PATENT DOCUMENTS

| | | | |
|---|---|---|---|
| 4,757,395 | * | 7/1988 | Nishikawa et al. ...................... 360/46 |
| 5,623,378 | * | 4/1997 | Shibasaki et al. ...................... 360/67 |
| 6,038,090 | * | 3/2000 | Freitas ..................................... 360/46 |
| 6,072,644 | * | 6/2000 | Weinert ..................................... 360/1 |
| 6,114,905 | * | 9/2000 | Hashimoto et al. .................. 330/252 |

* cited by examiner

Primary Examiner—Robert Pascal
Assistant Examiner—Henry Choe
(74) Attorney, Agent, or Firm—William B. Kempler; Frederick J. Telecky, Jr.

(57) ABSTRACT

The object of the invention is to realize an MR amplifier circuit that is operable with a single power supply voltage, and in which the CMRR can be maintained large. Current supply circuit (10) supplies a prescribed current ($I_B$) to MR element (20) in response to a control signal ($S_D$), the current of resistive element (R2) that is connected between node (ND2) and ground potential is set by means of the equivalent current circuit (40), the current that flows in resistive element (R2) is controlled in response to potential changes of node (ND2) when a noise is applied to MR element (20), and current changes of MR element (20) are suppressed. Due to the fact that a voltage drop that is generated in MR element (20) is amplified by amplifier (30) that is operated with a single power supply voltage, and since the resistance changes of MR element (20) accompanying changes in the magnetic field are detected, an amplifier circuit can be realized wherein the strength of the magnetic field can be detected, the CMRR can be kept high, and the effects due to in-phase noise can be minimized.

12 Claims, 4 Drawing Sheets

AMPLIFIER CIRCUIT

FIELD OF THE INVENTION

This invention relates to an amplifier circuit that amplifies the voltage of an MR element in an MR (Magneto resistive) head.

BACKGROUND OF THE INVENTION

In an MR head, the resistive value of an MR element changes relative to the changes of a magnetic field. In other words, an MR element is handled in the circuit construction a variable resistor in which the resistance value changes in response to the strength of the magnetic field that is applied. Because of this, when a constant current flows in the MR element, since the voltage drop that is generated in the said MR element changes relative to changes in the magnetic field, it is possible to detect the magnetic field strength by detecting the voltage drop of the MR element. Also, it is possible to detect the magnetic field strength by applying a constant voltage to an MR element, and detecting the current that flows in said MR element.

Figure 6:
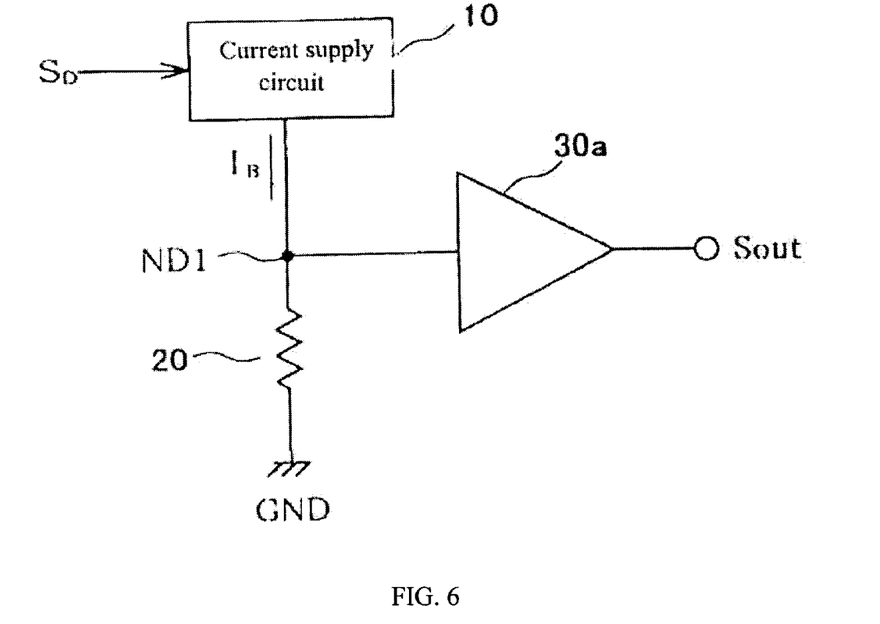
FIG. 6 is a schematic showing the construction of a system using a conventional single-end type MR head amplifier.
Figure 7:
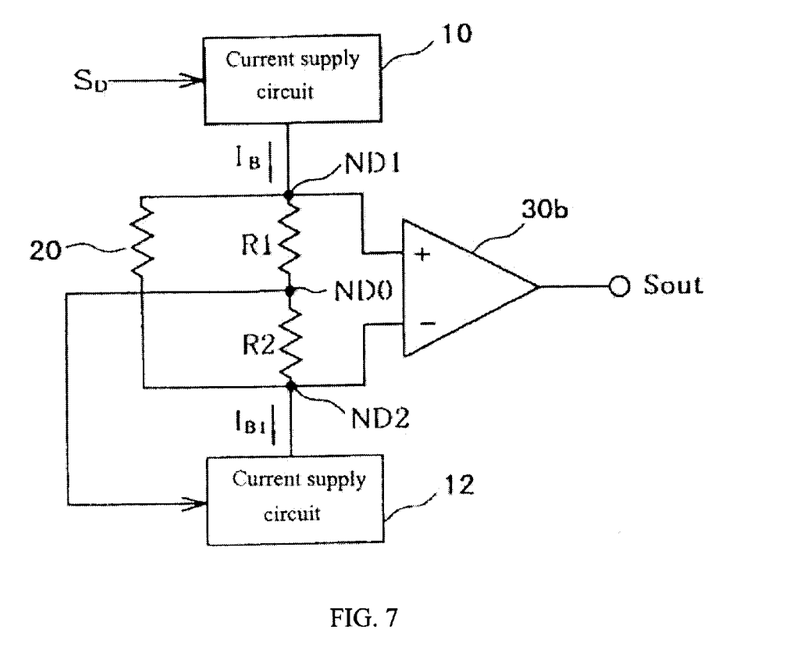
FIG. 7 is a schematic showing the construction of a system using a conventional differential type MR head amplifier.

The pre-amp that detects the voltage drop of an MR element depends on the application system for the voltage for the MR element. There are two types: a single-end type and a differential type. FIGS. 6 and 7 respectively show the construction of a single-end type and a differential type pre-amp.

As is shown in FIG. 6, the system that uses an amplifier of the single-end type is constructed by means of current supply circuit (10) that supplies current ($I_B$) to MR element (20), and amplifier (30a).

Current supply circuit (10) supplies current ($I_B$) that is set in response to a control signal ($S_D$) to MR element (20), and since the resistance value of MR element (20) changes in response to the magnetic field strength, the voltage of node (ND1) is determined by said resistance value and current ($I_B$). Since the voltage of node (ND1) is amplified by amplifier (30a), and amplified signal ($S_{out}$) is output, the magnetic field strength can be detected corresponding to signal ($S_{out}$).

In a system that uses the differential type amplifier shown in FIG. 7, MR element (20) is connected between nodes (ND1) and (ND2). Also, resistive elements (R1) and (R2) are series-connected between nodes (ND1) and (ND2). Current ($I_B$) is supplied to node (ND1) by current supply circuit (10). On the other hand, current ($I_{B1}$) that flows in the direction of node (ND2) to current supply circuit (12) is supplied by current supply circuit (12).

Output current ($I_{B1}$) of current supply circuit (12) is controlled corresponding to the voltage of contact point (ND0) for resistive elements (R1) and (R2). Normally, the supply current ($I_{B1}$) of current supply circuit (12) is controlled such that the potential of node (ND0) becomes ground potential (GND).

Since the potential difference between nodes (ND1) and (ND2) is amplified by differential amplifier (30), and the amplified signal ($S_{out}$) is output, the resistance value for MR element (20) corresponding to said output signal ($S_{out}$) can be detected, and, furthermore, the magnetic field strength can be detected.

Because MR element (20) is susceptible to static electricity, it is necessary that the potential of MR element (20) in regard to the circuit construction be considered to make it as close as possible to ground potential (GND). In the system using the differential type amplifier shown in FIG. 7, since the middle point of MR element (20) is maintained at ground potential (GND), electrostatic breakdown is effectively prevented. Also, in the system using the single-end type amplifier shown in FIG. 6, due to the fact that the supply current ($I_B$) of current supply circuit (10) is set small and the potential of node (ND1) is maintained at a level close to 0.1 to 0.2 V, its electrostatic breakdown can be prevented. Since the single-end type amplifier can be operated with a single power supply voltage, its circuit construction is simple.

Incidentally, with the system that uses the above-mentioned single-end type amplifier, in the event in-phase noise is applied to MR element (20) due to noise, in other words, in the event a noise component of the same phase appears at both ends of MR element (20), since said noise component is amplified by means of amplifier (30a) and appears on output signal ($S_{out}$), it is susceptible to in-phase noise. In other words, the common mode removal ratio (CMRR) for this type of amplifier is small.

On the other hand, in principle with the system using the differential type amplifier, the CMRR can be increased up to a high frequency region, but because the middle point of MR element (20) is maintained at almost ground potential (GND), a negative power supply voltage becomes necessary; thus there is the disadvantage that the circuit construction becomes complicated.

This invention was made based on this type of information, and its purpose is to offer an amplifier circuit used for an MR head that is operable with a single power supply voltage, and in which a large CMRR can be maintained.

SUMMARY OF THE INVENTION

In order to achieve the above-mentioned purposes, the amplifier circuit of this invention has an MR element in which the resistance value changes in response to the strength of a magnetic field, a current supply means that supplies a prescribed current to the first terminal of the above-mentioned MR element, a resistive element that is connected between the second terminal of the above-mentioned MR element and ground potential, a current control means that, when the potential of the above-mentioned second terminal changes, supplies a current to the above-mentioned second terminal that is equivalent to the current change amount of the above-mentioned resistive element that is generated by means of the said potential change of the terminal, and an amplifying means that amplifies the voltage difference of the above-mentioned first terminal and second terminal, and outputs an amplified signal.

In this invention, preferably, the above-mentioned current control means has a first current source and a first transistor that are series-connected between the supply line for the power supply voltage and the above-mentioned second terminal, a second current source, a second transistor, and a second resistive element that are series-connected between the supply line for the above-mentioned power supply voltage and the above-mentioned ground potential, a third resistive element that is connected between the connecting point for the above-mentioned first current source and first transistor and the connecting point for the above-mentioned second current source and second transistor, and a second current supply means that supplies almost the same current as the above-mentioned current supply means to a connecting point between the above-mentioned second transistor and the above-mentioned second resistive element; the control terminal for the above-mentioned first transistor is connected to the connecting point between the above-mentioned second transistor and the above-mentioned second resistive element, and the control terminal for the above-mentioned second transistor is connected to the above-mentioned second terminal.

Also, in this invention, preferably, the above-mentioned current control means has a first current source, a first transistor, and a second transistor that are series-connected between the supply line for the power supply voltage and the above-mentioned second terminal, a second current source, a third transistor, a fourth transistor, and a second resistive element that are series-connected between the supply line for the above-mentioned power supply voltage and the above-mentioned ground potential, a third resistive element that is connected between the connecting point for the above-mentioned first current source and first transistor, and the connecting point for the above-mentioned second current source and third transistor, a fourth resistive element that is connected between the control terminal of the above-mentioned second transistor and the above-mentioned second terminal, a fifth resistive element that is connected between the control terminal for the above-mentioned fourth transistor and the connecting point for the said fourth transistor and the above-mentioned second resistive element, and a second current supply means that supplies current in response to the supply current of the above-mentioned current supply means to the control terminal of the above-mentioned fourth transistor; the control terminal of the above-mentioned first transistor is connected to the connecting point for the above-mentioned third transistor and the above-mentioned fourth transistor, and the control terminal of the above-mentioned third transistor is connected to the connecting point for the above-mentioned first transistor and the above-mentioned second transistor.

Furthermore, in this invention, the above-mentioned amplifying means preferably has a resistive element, a first amplifier transistor, and a second amplifier transistor that are series-connected between the supply line for the above-mentioned power supply voltage and ground potential, the control terminal of the above-mentioned first amplifier transistor is connected to the above-mentioned second terminal via a capacitor, and the control terminal of the above-mentioned second amplifier transistor is connected to the above-mentioned first terminal. Also, the control terminal of the above-mentioned first amplifier transistor is connected to the above-mentioned first terminal via a capacitor, and the control terminal of the above-mentioned second amplifier transistor is connected to the above-mentioned second terminal. In an amplifier means that is constructed in this manner, the above-mentioned amplified signal is output from the connection point for the above-mentioned resistive element and the above-mentioned first amplifier transistor.

REFERENCE NUMERALS AND SYMBOLS AS SHOWN IN THE DRAWINGS

In the figures, 10 represents the current supply circuit; 20 the MR element; 30, 30*a*, AND 30*b* the amplifier circuits; 40, and 40*a* the equivalent current circuit; 42 and 42*a* the current supply circuits; R1, R2, and R3 the resistive element; IS1, and IS2 the current source; P1, P2, P3, P4, PT1, and PT2 the pnp transistor; NT1, and NT2 the npn transistor; $V_{cc}$ the power supply voltage; and GND the ground potential.

DESCRIPTION OF THE EMBODIMENTS

Figure 1:
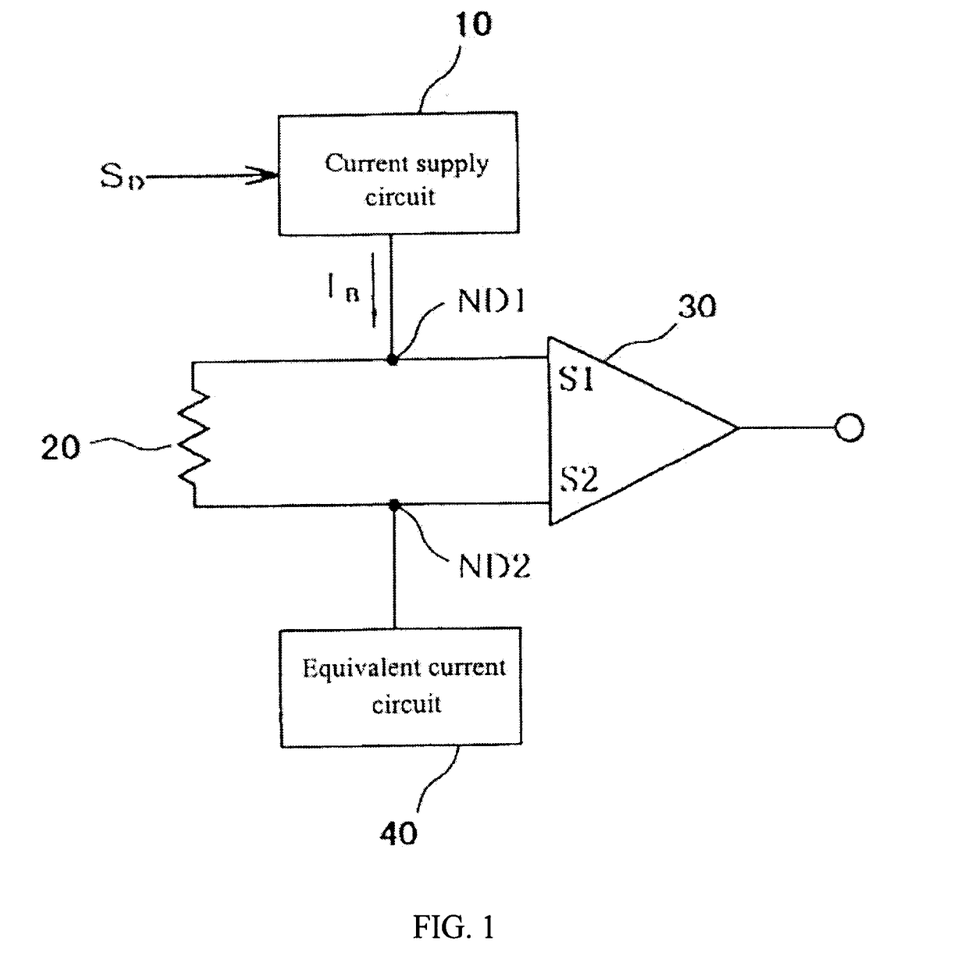
FIG. 1 is a schematic showing the principles of an MR head amplifier circuit related to this invention.

FIG. 1 is a schematic showing the principles of an amplifier circuit related to this invention.

As is illustrated, the amplifier circuit of this embodiment configuration is constructed by means of a current supply circuit (10), an MR element (20), an amplifier (30), and an equivalent current circuit (current control means) (40).

Current supply circuit (10) generates a current ($I_B$) that is set in response to a control signal ($S_D$) from an external section, and supplies it to MR element (20).

MR element (20), for example, is provided in a magnetic head of a magnetic readout device, and when reading out a recorded signal from a magnetic recording medium such as a magnetic disk or a magnetic tape, since the resistance value changes in response to changes in the strength of the magnetic field, the voltage drop that is generated in said MR element due to current ($I_B$) changes. In other words, as is shown in FIG. 1, the voltage difference between nodes (ND1) and (ND2) is set in response to the magnetic field strength.

The equivalent current circuit (40) has a resistance of equivalent negative properties, generates the desired current, and by means of supplying it to node (ND2), sets node (ND2) to the prescribed DC potential. When the potential of node (ND2) changes due to noise and the like that is applied to MR element (20), the equivalent current circuit (40) supplies to the above-mentioned second terminal a current that is equivalent to the current change amount that was generated due to potential changes of node (ND2), the current that flows in MR element (20) is held constant, and the influence of the noise is suppressed.

Figure 2:
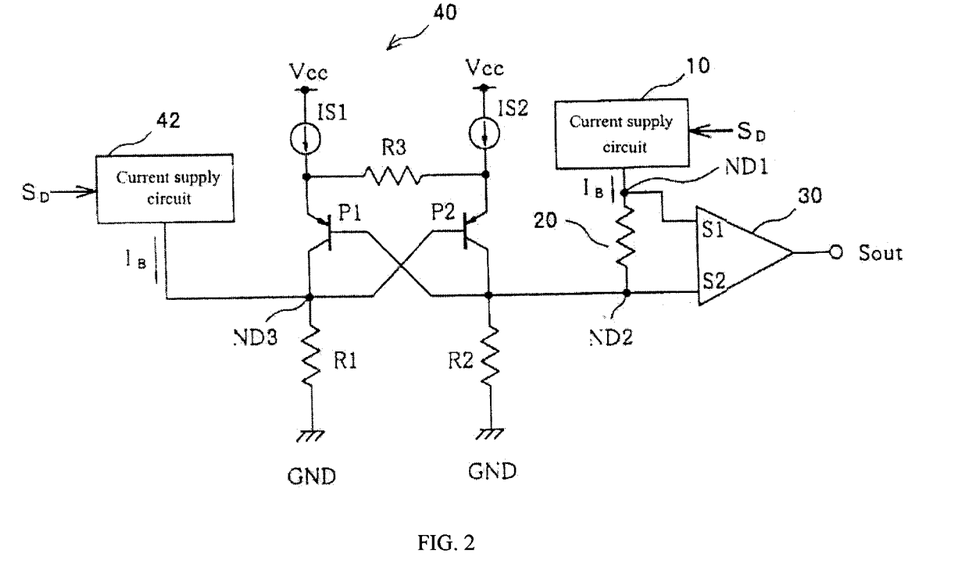
FIG. 2 is a schematic showing Embodiment Configuration 1 of an amplifier circuit of this invention.

FIG. 2 shows a concrete construction example of the equivalent current circuit (40), and shows Configuration Embodiment 1 of an amplifier circuit of this invention.

As is illustrated, the equivalent current circuit (40) is constructed by means of a current supply circuit (42), current sources (IS1, IS2), resistive elements (R1, R2, R3), and pnp transistors (P1, P2).

MR element (20) is connected between nodes (ND1) and (ND2), current supply circuit (10) is connected to node (ND1), and node (ND2) is connected to the equivalent current circuit (40).

In the equivalent circuit (40), current source (IS1), transistor (P1), and resistive element (R1) are series-connected between the supply line for power supply voltage ($V_{cc}$) and ground potential (GND). Node (ND3) is formed by the connection point between the collector of transistor (P1) and resistor (R1). Also, current source (IS2), transistor (P2), and resistive element (R2) are series-connected between the supply line for power supply voltage ($V_{cc}$) and ground potential (GND), and node (ND2) is connected to the connecting point for the collector of transistor (P2) and resistive element (R2).

Resistive element (R3) is connected between the emitters of transistors (P1) and (P2). Node (ND3) is connected to power supply circuit (42). Current supply circuit (42) generates current ($I_B$) the same as current supply circuit (10) in response to control signal ($S_D$), and supplies it to node (ND3).

In an amplifier circuit that is constructed in this manner, node (ND2) is held at a prescribed DC potential, for example, 0.1 V, by means of the equivalent current circuit (40). A difference voltage is generated corresponding to the magnetic field strength between node (ND1) and node (ND2), and since said voltage difference is amplified by means of amplifier (30), the magnetic field strength can be detected in response to output signal ($S_{out}$) of amplifier (30).

Below, an explanation is given of the operation of the amplifier circuit of this embodiment configuration with reference to FIG. 2. In the equivalent current circuit (40), the resistance value of resistive elements (R1) and R2) are assumed to be equivalent, and, for example, are made 20 Ω. Resistive element (R3) is assumed to have a resistance value of twice that of resistive elements (R1) and (R2). The currents of current sources (IS1, IS2) are equal, and are both assumed to be, for example, 1 mA. Also, supply current ($I_B$) for current supply circuits (10) and (42) are assumed to be set within a range of, for example, 2 to 10 mA.

A current flows in resistive element (R2) that is equivalent to the sum of the supply currents of current source (IS2) and current supply circuit (10). Because of this, for example, in the event a current ($I_B$) of 4 mA is supplied from current supply source (10) corresponding to control signal (Sn), and current sources (IS1, IS2) respectively supply a current of 1 mA, a current of 5 mA flows in resistive element (R2). If it is assumed that resistance value of resistive element (R2) is 20 Ω. the DC potential of node (ND2) is set to about 0.1 V.

Since current supply circuit (42) supplies a current ($I_B$) that is the same as that of current supply circuit (10), the DC potential of node (ND3) is also about the same as that of node (ND2), and is set to about 0.1 V.

Also, in the event the resistive value of MR element (20) becomes, for example, 50 Ω in response to the magnetic field strength of the magnetic recording medium, a voltage drop of 0.2 volts is generated at both ends of MR element (20).

When an in-phase signal, for example, an in-phase noise signal, is applied to MR element (20), the DC potential of node (ND2) rises. In other words, the base potential of transistor (P1) rises. Because of this, the current that flows in transistor (P1) decreases, and the DC potential of node (ND3) drops. When the potential of node (ND3) drops, the base potential of transistor (P2) drops, and the current of transistor (P2) increases. Here, if it is assumed that the equivalent emitter resistance of transistors (P1) and (P2) can be ignored, the increased amount of current of resistive element (R2) that accompanies the potential rise of node (ND2) can be compensated by means of transistor (P2).

Because of this, when the potential of node (ND2) rises because of noise or the like, the current that flows in MR element (20) changes very little.

Also, utilizing the same principles mentioned above, when the potential of node (ND2) drops due to an in-phase noise signal that is applied to MR element (20), the current of transistor (P1) increases, the DC potential of node (ND3) rises, since the current of transistor (P2) decreases in response to this, and since the current of transistor (P2) drops corresponding to the decreased amount of the current of resistive element (R2) that accompanies the drop of the potential of node (ND2), the current that flows in MR element (20) changes very little.

As was mentioned above, the current that flows in MR element (20) changes little even if the DC potential of node (ND2) changes, and the equivalent AC impedance of node (ND2) is extremely high. In other words, the equivalent current circuit (40) has characteristics equivalent to that of a constant current source which can supply an equivalently constant current.

Because of this, the current of MR element (20) is determined only by current ($I_B$) that is supplied by means of current supply circuit (10), and since it undergoes almost no influence due to noise and the like, the voltage difference between nodes (ND1) and (ND2) is determined by the resistance value of MR element (20) that is set in response to current ($I_B$) and the magnetic field strength. The voltage difference is amplified by means of amplifier (30), and the magnetic field strength can be detected based on that output signal ($S_{out}$).

In an equivalent current circuit (40) that represents the amplifier circuit shown in FIG. 2, the equivalent emitter resistance of transistors (P1, P2) cannot be completely ignored. Also, the power consumption is large, since a current that is the same as current ($I_B$) that flows in MR element (20) at node (ND3) is supplied to node (ND3) by means of current supply circuit (40a).

Figure 3:
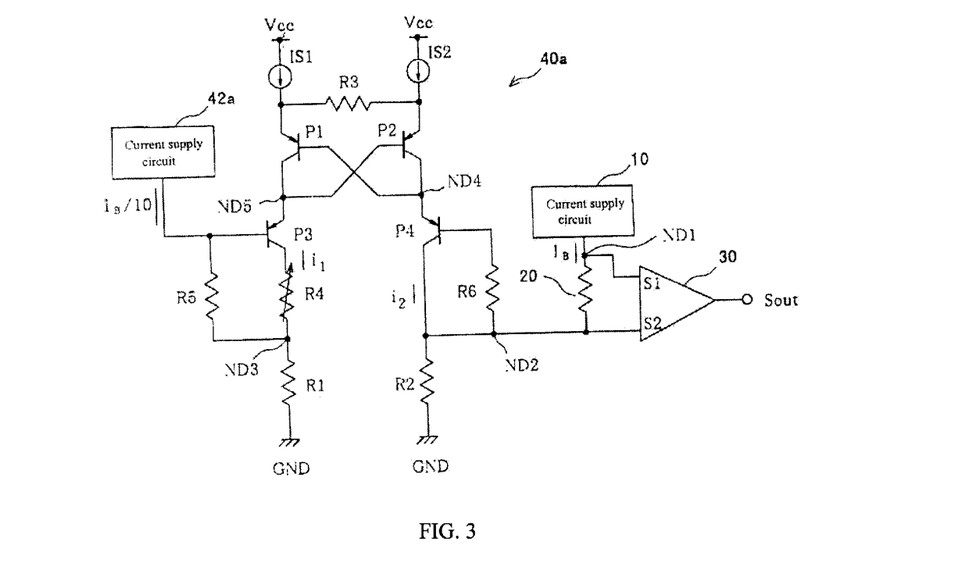
FIG. 3 is a schematic showing Embodiment Configuration 2 on an amplifier circuit of this invention.

FIG. 3 shows Embodiment Configuration 2 of an amplifier circuit that can improve the above-mentioned unfavorable features.

As is illustrated in the amplifier circuit of this embodiment configuration, except for the equivalent current circuit (40a), the other structural components, for example, current supply circuit (10), MR element (20), and amplifier (30), have the same construction and function as the respective partial circuits of the amplifier circuit shown in FIG. 2. Below, an explanation is given in regard to the amplifier circuit of this embodiment configuration centered about the construction and operation of the equivalent current circuit (40a).

As is shown in FIG. 3, the equivalent current circuit (40a) is constructed by means of a current supply circuit (42a), current sources (IS1, IS2), resistive elements (R1, R2, R3, R4, R5, R6), and pnp transistors (P1, P2, P3, P4).

Current source (IS1), transistors (P1, P3), and resistive elements (R4, R1) are series-connected between the supply line for power supply voltage ($V_{cc}$) and ground potential (GND), node (ND5) is formed by means of the contact point of the collector of transistor (P1) and the emitter of transistor (P3), and the collector of transistor (P3) is connected to resistive element (R4). (ND3) is formed by the connection point between resistors (R4) and (R1). The base of transistor (P3) is connected to power supply circuit (42a), and resistive element (R5) is connected between the base of transistor (P3) and node (ND3).

Current source (IS2), transistors (P2, P4) and resistive element (R2) are series-connected between the supply line for power supply voltage ($V_{cc}$) and ground potential (GND), and the connecting point for the collector of transistor (P2) and the emitter of transistor (P4) form node (ND4). The connecting point for the collector of transistor (P4) and resistive element (R2) is connected to node (ND2). Also, resistive element (R6) is connected between the base of transistor (P4) and node (ND2).

The base of transistor (P1) is connected to node (ND4), and the base of transistor (P2) is connected to node (ND5). Also, resistive element (R3) is connected between the emitters of transistors (P1) and (P2).

In the equivalent current circuit (40a) of FIG. 3, current supply circuit (42a) outputs a current of 1/10th the supply current of current supply circuit (10). Also, if the resistance value of resistive elements (R1) and (R2) are assumed to be equal and r, the resistance values of resistive elements (R5) and (R6) are both assumed to be 9r. For resistive element (R4) connected to the collector of transistor (P3), the resistance value is variable. By adjusting the resistance value of resistive element (R4), the balance of current ($i_1$) that flows on transistors (P1, P3) side and current ($i_2$) that flows on transistors (P2, P4) side can be adjusted. By this means, the DC potential of nodes (ND4) and (ND5) can be set equal when stable.

The total resistance value of resistive elements (R5) and (R1), and the total resistance value of resistive elements (R6) and (R2) are both 10r. Because of this, the base of transistors (P3) and (P4) are maintained at the same DC potential ($I_B \times r$). Node (ND4) and node (ND5) are held at the same DC potential in response to this, and the same current [amount] flows in transistors (P1) and (P2).

The equivalent emitter resistance of transistors (P1) and (P2) is canceled by means of transistors (P3) and (P4).

Below, an explanation is given in regard to the amplifier circuit of this example while referencing FIG. 3.

The DC potential of node (ND2) is determined by means of current ($i_2$) that flows in transistor (P4), output current ($I_B$) of current supply circuit (10), and the resistance value (r) of resistive element (R2), and becomes ($i_2+I_B$)×r.

When an in-phase signal, for example, in-phase noise signal, is applied to MR element (20), the DC potential of node (ND2) fluctuates. For example, in the event the potential of node (ND2) is raised by the influence of in-phase noise, the potential of node (ND4) also rises.

In other words, the base potential of transistor (P1) rises, and current ($i_1$) that flows in transistor (P1) drops. Because of this, the DC potential of node (ND5) drops, and current ($i_2$) that flows in transistor (P2) rises in response to this. In other words, the increased amount of the current of resistive element (R2) that accompanies the potential rise of node (ND2) can be compensated by means of the amount of increase in current that flows in transistors (P2) and (P4).

On the other hand, in the event the potential of node (ND2) drops because of noise or the like, the potential of node (ND4) also drops, and current ($i_1$) that flows in transistor (P1) increases. Because of this, the potential of node (ND5) rises, and current ($i_2$) that flows in transistor (P2) decreases. In other words, current ($i_2$) of transistors (P2, P4) also drops in response to the amount of the decrease of the current of resistive element (R2) accompanying the drop in the potential of node (ND2); and the amount of decrease of the current of resistive element (R2) can be compensated by means of the amount of the decrease of the current that flows in transistors (P2) and (P4).

As was explained above, regardless of the fact that the potential of node (ND2) changes due to noise that is applied to MR element (20), the current that flows in MR element (20) changes little. Because of this, the voltage drop that is generated in MR element (20), in other words, the voltage difference between nodes (ND1) and (ND2), is determined by means of output current ($I_B$) of current supply circuit (10) and the resistive value of MR element (20). Since amplifier (30) outputs an amplified signal ($S_{out}$) corresponding to the voltage difference of nodes (ND1) and (ND2), the detection of the magnetic field strength is possible in response to output signal ($S_{out}$) of amplifier (30).

As was explained above, the resistance value of MR element (20) changes about a center of, for example, 50 Ω, in response to the magnetic strength. Also, when a current ($I_B$) of, for example, 4 mA is supplied by means of current supply circuit (10), the voltage drop that is generated in MR element (20), is about 200 mV, in other words, 0.2 V. On the other hand, the potential of node (ND2) is held at, for example, 0.1 V. Because of this, in order to amplify a minute voltage drop that is generated at MR element (20)-in other words, the voltage difference between nodes (ND1) and (ND2)-a method that uses a differential amplifier circuit with a high CMRR is useful.

However, in order to amplify the voltage difference between nodes (ND1) and (ND2) by using the ordinary differential amplifier circuit, a negative voltage source becomes necessary in the differential amplifier circuit. This invention, in order to operate a system by a single power supply voltage ($V_{cc}$), uses the amplifier circuits shown in FIG. 4 and FIG. 5. These amplifier circuits are used as amplifier (30) shown in FIGS. 1 to 3, the voltage for nodes (ND1) and (ND2) are input to terminals (S1) and (S2), respectively, and the difference of the input voltages is output [as] the amplified signal ($S_{out}$).

Figure 4:
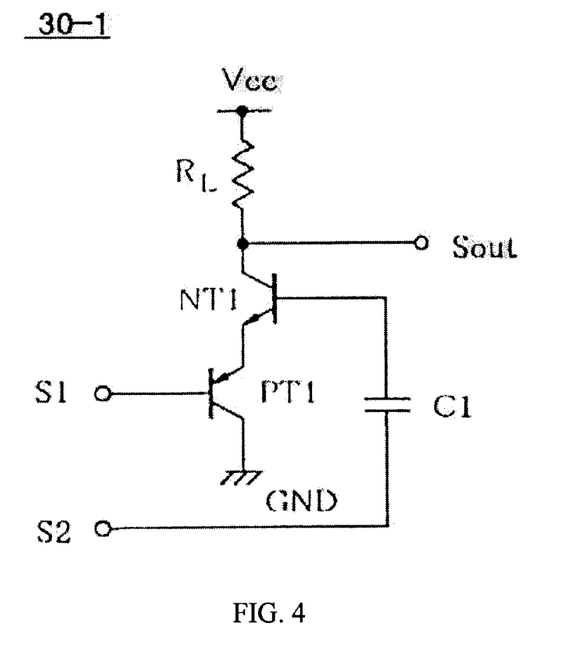
FIG. 4 is a schematic showing a construction example of an amplifier that is operated by a single power supply voltage.

FIG. 4 shows the construction of amplifier (30-1). As is illustrated, said amplifier (30-1) is constructed by resistive element ($R_L$), npn transistor (NT1), and pnp transistor (PT1), which are connected between the supply line for power supply voltage ($V_{cc}$) and ground potential (GND), and capacitor (C1) that is connected to the base of transistor (NT1).

Resistive element ($R_L$) forms a load resistor. The collector of transistor (NT1) is connected to resistive element ($R_L$), and the amplified signal ($S_{out}$) is output from that connecting point. The base of transistor (NT1) is connected to input terminal (S2) via capacitor (C1), and the emitter is connected to the emitter of transistor (PT1).

The base of transistor (PT1) is connected to input terminal (S1), and the collector is grounded. Then, input terminals (S1) and (S2) are respectively connected to nodes (ND1) and (ND2).

An amplifier (30-1) that is constructed in this manner is operable even in the event the potential of input terminal (S1) is close to 0 V. On the other hand, since the base of transistor (NT1) is connected to node (ND2) via capacitor (C1), with an AC equivalent circuit, the base of transistor (NT1) almost reaches ground potential. Since the current of transistor (PT1) is controlled in response to the signal voltage of input terminal (S1), the voltage drop, generated at load resistive element (RL) by means of said current, changes. In other words, output signal ($S_{out}$) is controlled by means of the input signal to input terminal (S1).

On the other hand, an in-phase noise signal appears at nodes (ND1) and (ND2) due to the noise that is applied to MR element (20). For example, in the event the potential of input terminals (S1) and (S2) both rise due to noise, due to the fact that the base potential of transistor (PT1) rises, the current that flows in transistor (PT1) has a tendency to decrease. On the other hand, as a result of the base potential of transistor (NT1) having risen, the current that flows in said transistor (NT1) has a tendency to increase. As a result of this, even if an in-phase noise appears at MR element (20) due to noise, the current that flows in load resistor ($R_L$) of amplifier (30-1) is held constant. In other words, the CMRR of the amplifier circuit can be kept high.

In an actual magnetic readout device, the readout of signals in a plurality of channels is necessary, and an amplifier (30-1) is provided at each channel. Because of this, a plurality of capacitors becomes necessary. As the number of capacitors is increased, for example, in the event all of the capacitors are externally attached, the number of terminals of the IC chip increases with the disadvantage that the package becomes large. Because of this, in an actual circuit construction, only one externally attached capacitor is provided, and this capacitor is successively switched to each amplifier circuit by means of a changeover switch that is implemented by a CMOS transistor. By means of this type of implementation, one capacitor can be shared by a plurality of amplifier circuits, the increase of the number of terminals of the IC chip can be minimized, and miniaturization of the package can be realized.

Figure 5:
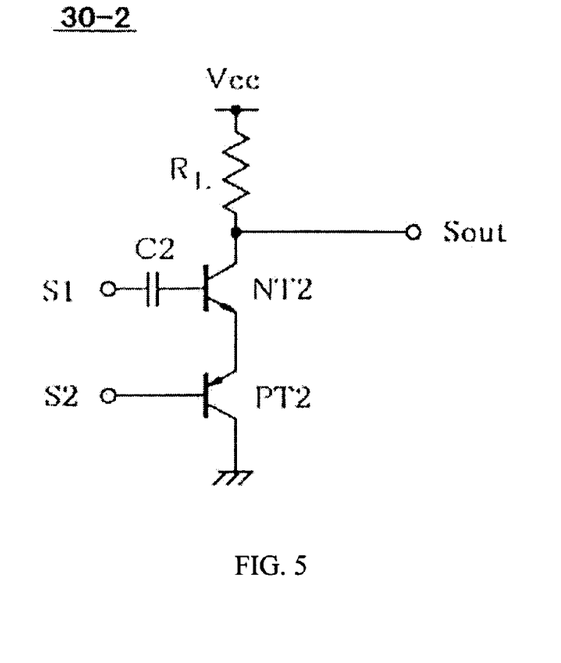
FIG. 5 is a schematic showing another construction example of an amplifier that is operated by a single power supply voltage.

The construction of amplifier (30-2) is shown in FIG. 5. As is illustrated, amplifier (30-2) is constructed in almost the same manner as amplifier (30-1) shown in FIG. 4, by means of a resistive element ($R_L$), an npn transistor (NT2), and a pnp transistor (PT2), which are seriesconnected between the supply line for power supply voltage ($V_{cc}$) and ground potential (GND). However, in amplifier (30-2), the base of transistor NT2 is connected to input terminal (S1) through the medium of a capacitor (C2), and the base of transistor (PT2) is connected to DC input terminal (S2). Input terminals (S1) and (S2) are respectively connected to nodes (ND1) and (ND2) shown in FIG. 1.

In an amplifier (30-2) that is constructed in this manner, since the current of transistor (NT2) is controlled in response to the level of the signal that is input to input terminal (S1), a voltage drop is generated in load resistive element ($R_L$) by the current of transistor (NT2). Because of this, output signal ($S_{out}$) is controlled in response to the input signal of input terminal (S1).

When an in-phase noise signal appears at both terminals of MR element (20) due to noise, the level of nodes (ND1) and (ND2) change in phase. For example, when the levels of nodes (ND1) and (ND2) rise at the same time, the signal levels also both rise at input terminals (S1) and (S2) at amplifier (30-2), and when the base potential of transistor (NT2) rises, the current of transistor (NT2) has a tendency to increase. On the other hand, when the base current of transistor (PT2) rises, the current of transistor (PT2) has a tendency to decrease. Conversely, even in the event the potential of input terminals (S1) and (S2) both decrease due to the influence of noise, the current of transistors (NT2) and (PT2) is held almost constant.

Because of this, in the event an in-phase noise signal is input to input terminals (S1) and (S2), the current that flows in transistors NT2) and (PT2) does not undergo the effects of the noise, and is held almost constant. Because of this, amplifier (30-2) shows high CMRR characteristics and the effects of in-phase noise can be decreased.

As was explained above, according to each embodiment configuration of this invention, current supply circuit (10) supplies a prescribed current ($I_B$) to MR element (20) in response to control signal ($S_D$), the current of resistive element (R2) that is connected between node (ND2) and ground potential is set by means of the equivalent current circuit (40), the current that flows in resistive element (R2) is controlled in response to the potential change of node (ND2) when a noise is applied to MR element (20), and the current change of MR element (20) is minimized. Due to the fact that the voltage drop that is generated at MR element (20) is amplified by amplifier (30) that is operated by a single power supply voltage, a resistance change of MR element (20) that accompanies a change in the magnetic field is detected. Since the strength of the magnetic field can be detected, an amplifier circuit that is operated by a single power supply voltage can be constructed, the CMRR can be kept high, and an amplifier circuit in which the effects due to in-phase noise is minimized can be realized.

EFFECTS OF THE INVENTION

As was explained above, according to the amplifier circuit of this invention, there are the advantages that the CMRR of the amplifier circuit can be kept high, and it can be operated with a single power supply voltage while reducing the effects of in-phase noise.

What is claimed is:

1. An amplifier circuit comprising:
a magneto-resistive (MR) element in which the resistance value changes in response to the strength of a magnetic field,
a current supply means that supplies a prescribed current to the first terminal of the MR element,
a resistive element that is connected between a second terminal of the MR element and ground potential,
a current control means responsive to changes in a potential of the second terminal for supplying a current to the second terminal that opposes the current change in the MR element generated by an in-phase noise signal, for minimizing changes in said predetermined current flow through said MR element,
and an amplifying means that amplifies the voltage difference of the first terminal and second terminal, and outputs an amplified signal.

2. An amplifier circuit comprising:
a magneto-resistive (MR) element in which the resistance value changes in response to the strength of a magnetic field,
a current supply means that supplies a prescribed current to the first terminal of the MR element,
a resistive element that is connected between a second terminal of the MR element and ground potential,
a current control means that, when the potential of the second terminal changes, supplies a current to the second terminal that is equivalent to the current change amount of the resistive element that is generated by means of the potential change of the terminal,
and an amplifying means that amplifies the voltage difference of the first terminal and second terminal, and outputs an amplified signal, wherein:
the current control means has a first current source and a first transistor that are series-connected between a supply line for the power supply voltage and the second terminal,
a second current source, a second transistor, and a second resistive element that are series-connected between the supply line for the power supply voltage and the ground potential,
a third resistive element that is connected between the connecting point for the first current source and first transistor and the connecting point for the second current source and second transistor,
and a second current supply means that supplies an equivalent current as the current supply means to a connecting point between the second transistor and the second resistive element, wherein the control terminal of the first transistor is connected to the connecting point between the second transistor and the second resistive element, and the control terminal for the second transistor is connected to the second terminal.

3. The amplifier circuit of claim 1 wherein:

the current control means has a first current source, a first transistor, and a second transistor that are series-connected between the supply line for the power supply voltage and the second terminal, a second current source, a third transistor, a fourth transistor, and a second resistive element that are series-connected between the supply line for the power supply voltage and the ground potential, a third resistive element that is connected between the connecting point for the first current source and first transistor, and the connecting point for the second current source and third transistor, a fourth resistive element that is connected between the control terminal of the second transistor and the second terminal, a fifth resistive element that is connected between the control terminal for the fourth transistor and the connecting point for the said fourth transistor and the second resistive element, and a second current supply means that supplies current in response to the supply current of the current supply means to the control terminal of the fourth transistor, wherein the control terminal of the first transistor is connected to the connecting point for the third transistor and the fourth transistor, and the control terminal of the third transistor is connected to the connecting point for the first transistor and the second transistor.

4. The amplifier circuit of claim 1 further comprising:

the amplifying means with a resistive element, a first amplifier transistor, and a second amplifier transistor, are series-connected between the supply line for the power supply voltage and ground potential, wherein the control terminal of the first amplifier transistor is connected to the second terminal by way of a capacitor, the control terminal of the second amplifier transistor is connected to the first terminal, and the signal of the amplifier is output from the connecting point for the resistive element and the first amplifier transistor.

5. The amplifier circuit of claim 1 further comprising:

the amplifying means with a resistive element, a first amplifier transistor, and a second amplifier transistor, are series-connected between the supply line for the power supply voltage and ground potential, wherein the control terminal of the first amplifier transistor is connected to the first terminal through the medium of a capacitor, the control terminal of the second amplifier transistor is connected to the second terminal, and the signal of the amplifier is output from the connecting point for the resistive element and the first amplifier transistor.

6. The amplifier circuit of claim 4 wherein the first and second amplifier transistors are constructed by means of an npn transistor and a pnp transistor in which the emitters are connected to each other.

7. The amplifier circuit of claim 5 wherein the first and second amplifier transistors are constructed by means of an npn transistor and a pnp transistor in which the emitters are connected to each other.

8. The amplifier circuit of claim 2 wherein:

the current control means has a first current source, a first transistor, and a second transistor that are series-connected between the supply line for the power supply voltage and the second terminal, a second current source, a third transistor, a fourth transistor, and a second resistive element that are series-connected between the supply line for the power supply voltage and the ground potential, a third resistive element that is connected between the connecting point for the first current source and first transistor, and the connecting point for the second current source and third transistor, a fourth resistive element that is connected between the control terminal of the second transistor and the second terminal, a fifth resistive element that is connected between the control terminal for the fourth transistor and the connecting point for the said fourth transistor and the second resistive element, and a second current supply means that supplies current in response to the supply current of the current supply means to the control terminal of the fourth transistor, wherein the control terminal of the first transistor is connected tot connecting point for the third transistor and the fourth transistor, and the control terminal of the third transistor is connected to the connecting point for the first transistor and the second transistor.

9. The amplifier circuit of claim 2 further comprising:

the amplifying means with a resistive element, a first amplifier transistor, and a second amplifier transistor, are series-connected between the supply line for the power supply voltage and ground potential, wherein the control terminal of the first amplifier transistor is connected to the second terminal by way of a capacitor, the control terminal of the second amplifier transistor is connected to the first terminal, and the signal of the amplifier is output from the connecting point for the resistive element and the first amplifier transistor.

10. The amplifier circuit of claim 2 further comprising:

the amplifying means with a resistive element, a first amplifier transistor, and a second amplifier transistor, are series-connected between the supply line for the power supply voltage and ground potential, wherein the control terminal of the first amplifier transistor is connected to the first terminal through the medium of a capacitor, the control terminal of the second amplifier transistor is connected to the second terminal, and the signal of the amplifier is output from the connecting point for the resistive element and the first amplifier transistor.

11. The amplifier circuit of claim 9 wherein the first and second amplifier transistors are constructed by means of an npn transistor and a pnp transistor in which the emitters are connected to each other.

12. The amplifier circuit of claim 10 wherein the first and second amplifier transistors are constructed by means of an npn transistor and a pnp transistor in which the emitters are connected to each other.

* * * * *